United States Patent

Merrill et al.

[11] Patent Number: 5,904,510
[45] Date of Patent: May 18, 1999

[54] POWER TRANSISTOR DEVICE HAVING ULTRA DEEP INCREASED CONCENTRATION REGION

[75] Inventors: Perry Merrill, Ed Segundo; Herbert J. Gould, Sherman Oaks, both of Calif.

[73] Assignee: International Rectifier Corp., El Segundo, Calif.

[21] Appl. No.: 08/807,387

[22] Filed: Feb. 27, 1997

Related U.S. Application Data

[62] Division of application No. 08/316,112, Sep. 30, 1994, Pat. No. 5,766,966, which is a continuation of application No. 08/041,136, Mar. 30, 1993, abandoned, which is a continuation of application No. 07/521,177, May 9, 1990, abandoned.

[51] Int. Cl.⁶ .............................. H01L 21/00; H01L 21/84
[52] U.S. Cl. .......................... 438/154; 438/162; 438/295
[58] Field of Search ..................................... 438/154, 162, 438/295, 226, 325

[56] References Cited

FOREIGN PATENT DOCUMENTS

| 2082385 | 3/1982 | United Kingdom . |
| 224952 | 11/1991 | United Kingdom . |

OTHER PUBLICATIONS

Ghandhi, Sorab "VLSI Fabrication Principles Silicon and Gallium Arsenide", Second Edition, John Wiley & Sons, Inc., pp. 426–427, 1994.

Primary Examiner—John F. Niebling
Assistant Examiner—Michael S. Lebentritt
Attorney, Agent, or Firm—Ostrolenk, Faber, Gerb & Soffen, LLP

[57] ABSTRACT

A cellular insulated gate bipolar transistor ("IGBT") device employs increased concentration in the active region between spaced bases to a depth greater than the depth of the base regions. The implant dose which is the source of the increased concentration is about $3.5 \times 10^{12}$ atoms per centimeter squared and is driven for about 10 hours at 1175° C. Lifetime is reduced by an increased radiation dose to reduce switching loss without reducing breakdown voltage or increasing forward voltage drop above previous levels. The increased concentration region permits a reduction in the spacing between bases and provides a region of low localized bipolar gain, increasing the device latch current. The avalanche energy which the device can successfully absorb while turning off an inductive load is significantly increased. The very deep increased conduction region is formed before the body and source regions in a novel process for making the new junction pattern.

19 Claims, 10 Drawing Sheets

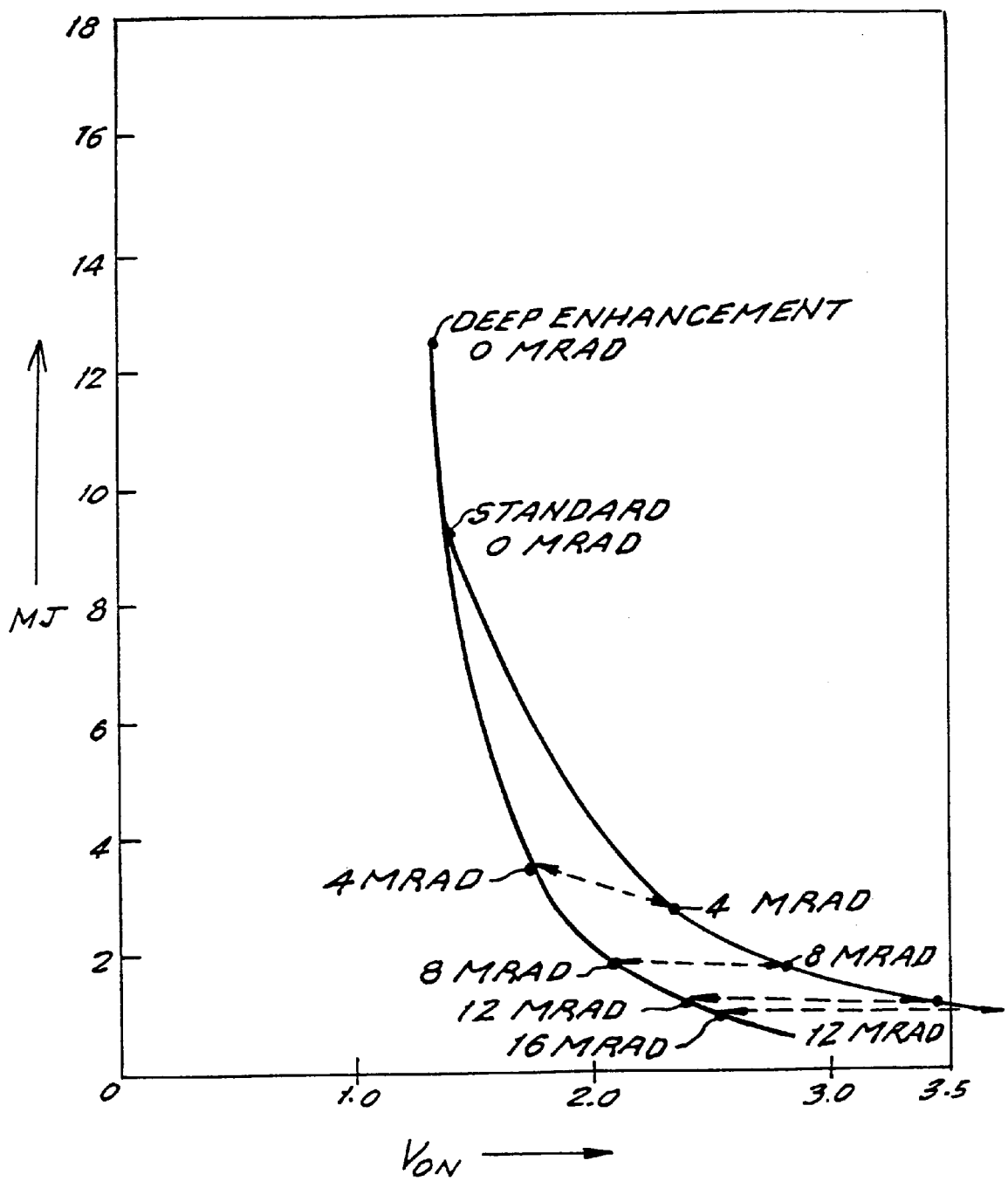

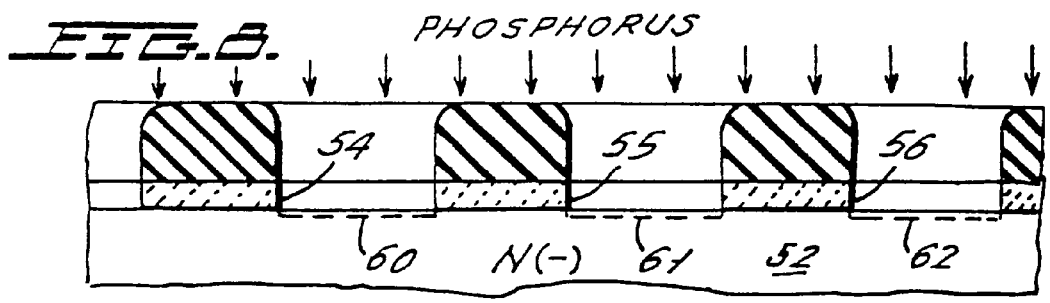
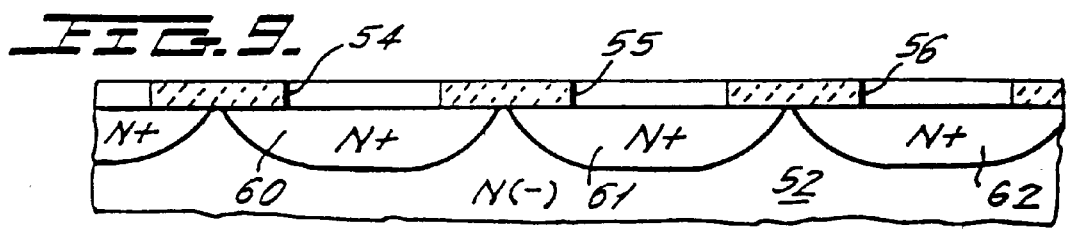
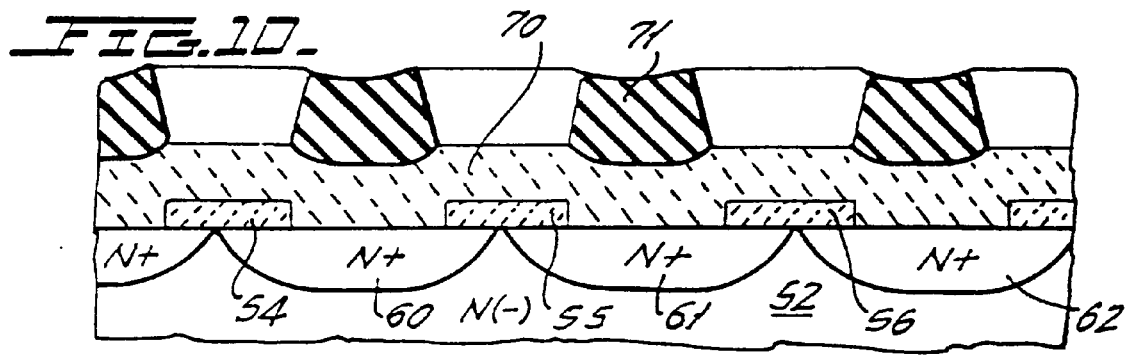
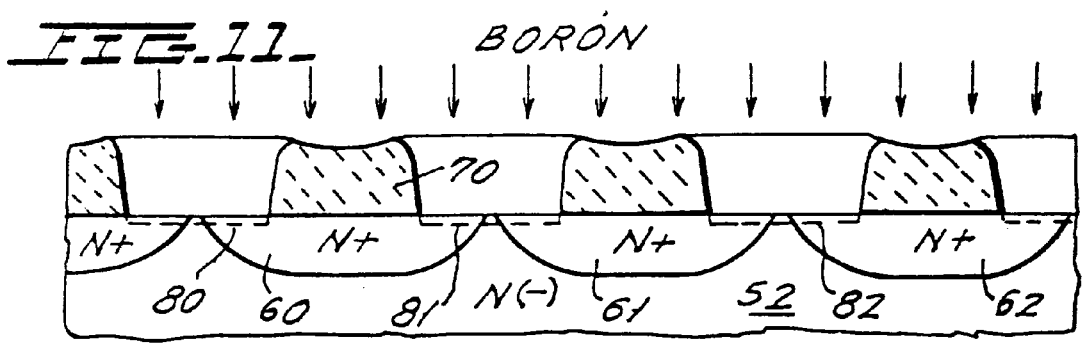
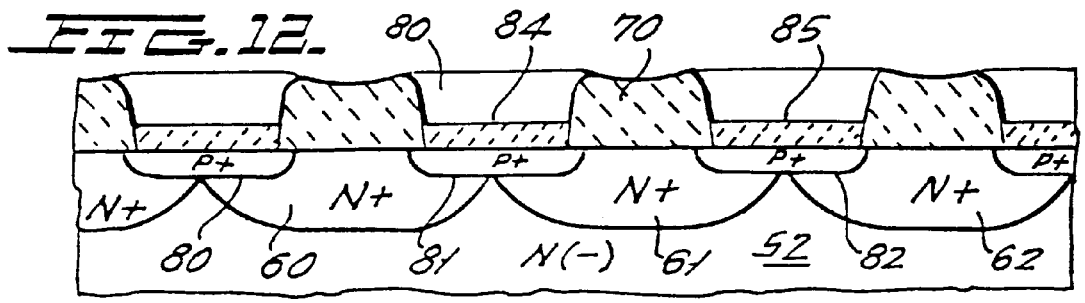

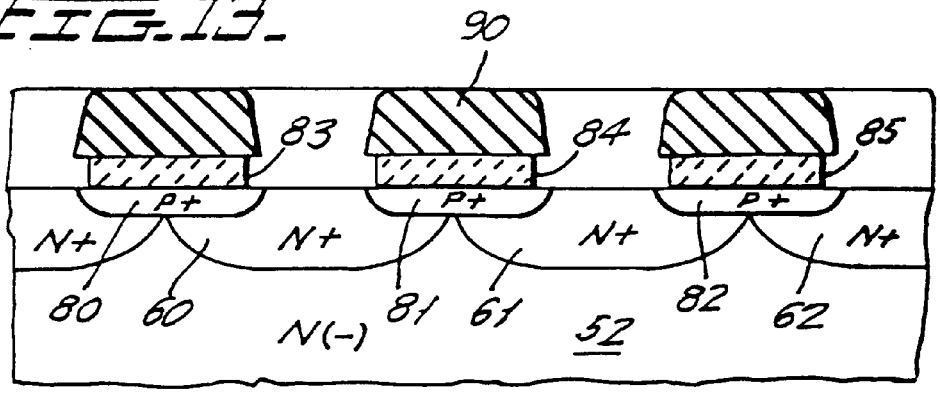
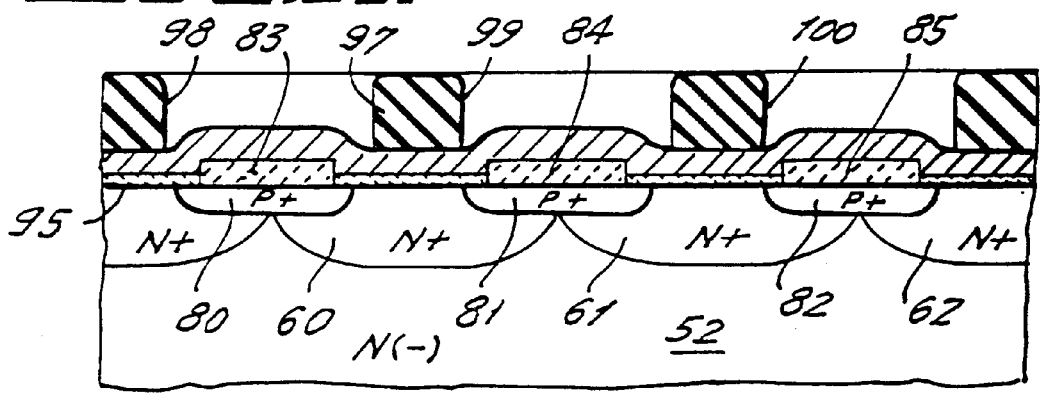
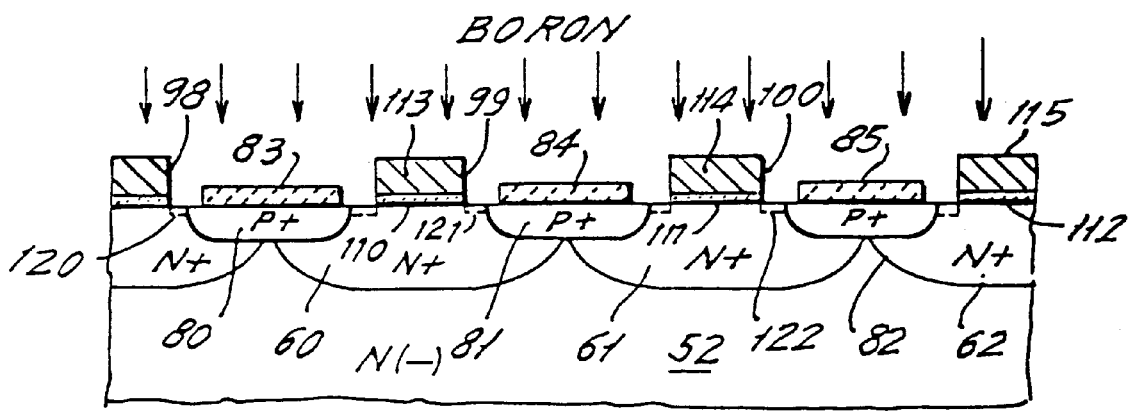

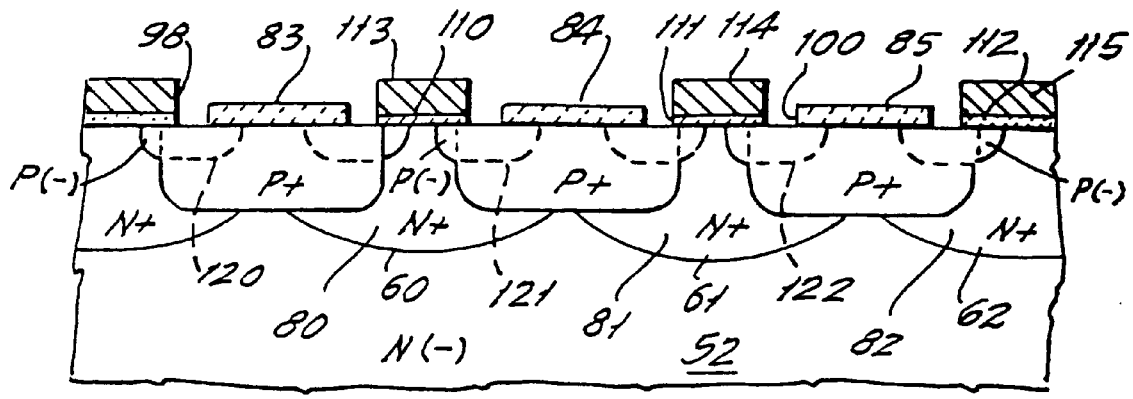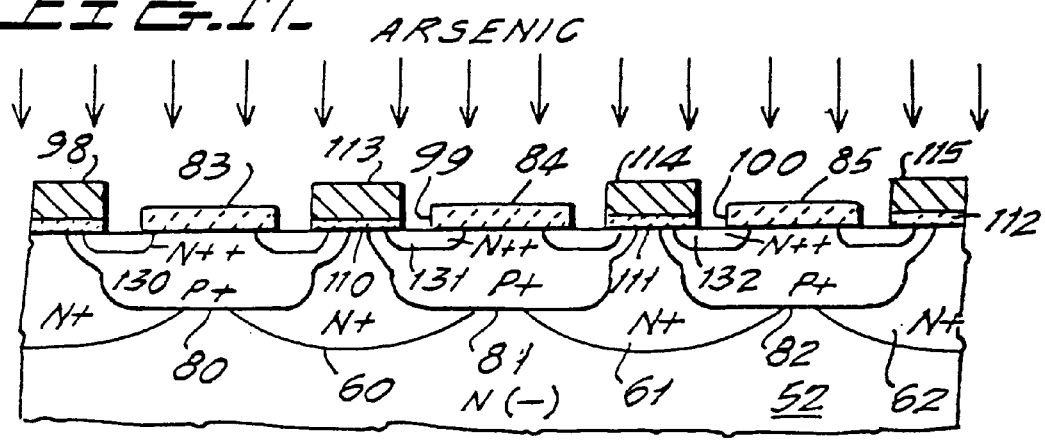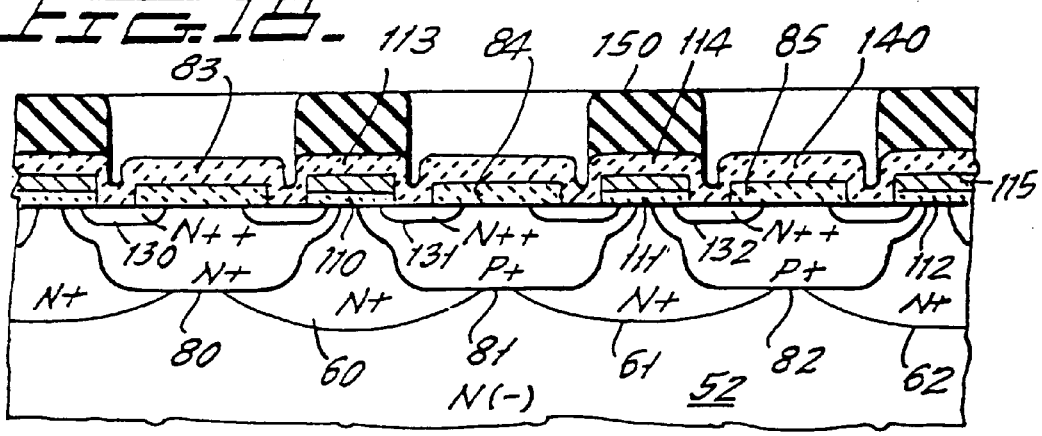

POWER TRANSISTOR DEVICE HAVING ULTRA DEEP INCREASED CONCENTRATION REGION

This is a division of application Ser. No. 08/316,112, filed Sep. 30, 1994, now U.S. Pat. No. 5,766,966, which is a continuation of Ser. No. 08/041,136, filed Mar. 30, 1993, (now abandoned) which is a continuation of Ser. No. 07/521,177, filed May 9, 1990, (now abandoned).

BACKGROUND OF THE INVENTION

This invention relates to structures for and methods of manufacture of power transistors, and more specifically relates to an increased concentration region between closely spaced base or body regions which is deeper than the bases. A very deep increased concentration region in an insulated gate bipolar transistor (hereinafter an "IGBT") permits a substantial increase in the latch current of the device and a substantial decrease in switching loss without increasing forward voltage drop and without significantly reducing breakdown voltage. When applied to either an IGBT or power MOSFET, the invention also forces a uniform avalanche breakdown from the bottoms of the deep increased concentration regions to improve the device $I^2L$ capability. The very deep increased concentration region also permits the use of heavy metal diffusion to increase lifetime killing and reduce switching loss without an excessive increase in forward voltage drop.

Power IGBT devices employ the low current gate control of a power MOSFET device, which is capable of very high switching speed in combination with a bipolar type of device which operates with a high current density. By a "power device" is meant a device having the capability of controlling more than approximately 1 watt, and is distinguished from the signal processing type of device which handles much smaller power levels. IGBT devices, while slower than a standard power MOSFET, are still much faster than comparable power bipolar transistors, are voltage controlled and have significantly higher current densities than comparable power MOSFETs.

IGBT devices are shown, for example, in U.S. Pat. No. 4,672,407 dated Jun. 9, 1987 and U.S. Pat. No. 4,364,073 dated Dec. 14, 1982.

A properly designed IGBT employs design principles which ordinarily would be used for a low voltage power MOSFET geometry, particularly very small line widths for the poly gate. However, the IGBT is used primarily at 500 volts and above so that the designer must use the low voltage design on a high voltage starting material which has a high resistivity relatively thick epitaxial material. A high resistivity epitaxial material must be used for receiving the junction patterns since the higher the resistivity of the material, the higher the voltage blocking capability of the device. This higher resistivity material ordinarily increases on-resistance.

Existing IGBT devices have switching frequencies less than about 25 kHz due primarily to a long fall time of collector current during turn-off. These long fall times produce high forward conduction switching losses, requiring increased silicon chip area to meet a given current rating. One way to reduce such forward conduction switching losses is to increase the space between base or body regions forming the device junction pattern. Increasing the space between bases leads to a poor packing density and an inefficient use of the silicon surface, and makes the device less immune to latch-up of the inherent parasitic thyristor present in the junction pattern. It would be desirable to reduce losses while keeping a small spacing between device cells.

The following terminology shall be used hereinafter to identify the electrode and functions of an N channel IGBT:

The emitter terminal of the packaged unit is connected to the front side power electrode of the die. It is sometimes called the cathode terminal and, in a power MOSFET, is the source terminal.

The collector terminal of the packaged unit is connected to the back side power electrode of the die. It is sometimes called the anode terminal and, in a power MOSFET, is the drain terminal. It is also the emitter of the internal PNP transistor.

The P-type base region of the MOSFET in the IGBT is sometimes called the body region. It is the base of the internal NPN transistor and is also the internal collector of the PNP transistor.

In general in an IGBT, the smaller the space between bases, the larger the latch current. More specifically, when an N channel IGBT operates in its forward conduction mode, carriers are injected across the back side emitter-base junction and toward the front side emitter electrode. If there is a large space between bases, a larger percentage of the full collector current flows into the side walls of the surface base regions and under the front side emitter and through the resistance $R_b'$ beneath the front side emitter. This can then latch the parasitic thyristor at a lower current. A smaller space between bases reduces this effect. However, if there is a small space between bases, there will be almost no conductivity modulation in that area since holes are swept away by collection at the bottom of the deep base junction before they can modulate the active region. Also, decreasing the space between the bases and increasing the length of the vertical conduction path between closely spaced bases also increases the pinch effect of the parasitic JFET defined between the bases. In a power MOSFET, this causes a substantial increase in device on-resistance, and in an IGBT it causes a substantial increase in the forward voltage drop. It would be desirable to have a small space between bases for a large latch current while also having a low forward voltage drop.

It is known that the efficiency of the parasitic JFET can be reduced by increasing the conductivity in the space between the bases of the MOSFET portion of the device. This is sometimes called an enhancement diffusion or increased conductivity region. Such increased conductivity regions for power MOSFETs are shown in U.S. Pat. Nos. 4,376,286 and 4,593,302, each of which is owned by the assignee of the present invention. Such increased conductivity regions are employed in the power MOSFET products sold by the assignee of the application under its registered trademark "HEXFET". In practice, the implant dose used to disable the parasitic JFET of a power MOSFET is about $1 \times 10^{12}$ atoms/$cm^2$. Higher doses will begin to degrade the reverse breakdown voltage of the MOSFET. This same kind of increased concentration region has also been used in prior art IGBT devices sold by the assignee of the present invention, for example, its IGBT part numbers IRGBC20, IRGBC30, IRGBC40, IRGPC40 and IRGPC50. These IGBTs use an implant dose of $3.5 \times 10^{12}$ atoms per $cm^2$ which is diffused to a depth deeper than the source, but shallower than the deep base. This enhancement diffusion increases latch current since it permits closer packing of the cells and, thus a smaller poly line width. However, this enhancement diffusion, due to its depth, does not offset the parasitic JFET over its full length.

Typically, the depth of the increased conductivity region in prior art IGBTs is about 3 microns while the deep base was about 6 microns. Furthermore, in these prior art IGBT devices, as manufacturing tolerances improved, the source region became smaller in lateral extent and the deep base larger and the shape of the base or body became more squared in cross-section. Thus, the effective length of the JFET between bases increased in length. However, the increased concentration region remained at about 3 microns in depth and extended for only about one half the length of the effective parasitic JFET produced between spaced bases. It would be desirable to be able to defeat the parasitic JFET over its full effective length.

In some cases, it may be desirable not to use any lifetime killing in an IGBT. However, the switching speed of an IGBT may be increased by reducing the lifetime of the carriers in the silicon. In prior art IGBTs sold by the assignee of the invention, lifetime was reduced by electron beam irradiation of the completed chip by a dose of about 8 megarads. This produced, in one particular device, a fall time of about 300 nanoseconds and a turn-off switching loss of about 600 microjoules. However, reduction of lifetime in an IGBT increases forward voltage drop since it reduces the gain of the bipolar transistor portion of the device. That is, there is less conductivity modulation for the same gate voltage in the presence of reduced gain. It would be desirable to lower switching losses by using a higher radiation dose without increasing forward voltage drop.

Electron irradiation is used in the assignee's prior art IGBTs instead of heavy metal doping, e.g. gold or platinum, because heavy metal doping increases the apparent resistivity in the active region between bases, thus further increasing the JFET pinch between bases. However, the effect of radiation can anneal out at die bond temperatures, which complicates the assembly process. Therefore, in many cases, heavy metal lifetime killing is preferred to radiation. It would be desirable to be able to use heavy metal doping in an IGBT without increasing forward voltage drop above that of a comparable electron irradiated IGBT.

An important characteristic of power MOSFETs and IGBTs is their avalanche energy. Generally, avalanche occurs at relatively few sites at the periphery of the device. Therefore, in the IGBT, the emitter base junction of the active bipolar transistor is non-uniformly biased and injects non-uniformly in small areas with high current density, leading to local failure. It would be desirable to improve the avalanche energy of a power MOSFET or IGBT.

From the above, it will be seen that the use of a narrower poly line width, that is, closely spaced bases, has the benefit of increasing latch current and the device current density, but the drawback of causing higher forward voltage drop. Lifetime killing can be used to increase switching speed at the expense of increased forward voltage drop.

BRIEF DESCRIPTION OF THE INVENTION

In accordance with the present invention, the increased concentration region between the spaced bases of an IGBT is made very deep, particularly deeper than the base. To this end, the deep increased concentration diffusion between bases is the first diffusion step in the process.

In a preferred embodiment of the invention, an implant dose of about $3.5 \times 10^{12}$ atoms per centimeter squared (phosphorus for an N channel device) is driven for a total of 10 hours at 1175° C. to reach a depth of about 7.0 microns which is deeper than the deep body region. An increased diffusion temperature can be used to shorten the drive time.

In contrast, the increased concentration region diffusion in the prior art IGBT of International Rectifier Corporation took place after forming the deep P+ base regions and was driven for only 2 hours at 1175° C. to reach a depth of about 3 microns, much less than the deep base depth of about 6 microns.

The lifetime killing radiation dose per wafer can be increased from 8 megarads used in the prior art IGBT of International Rectifier to 16 megarads because of the deeper increased concentration diffusion in the active region between bases. The fall time was then reduced in a particular device from 300 nanoseconds to 100 nanoseconds and the turn-off switching loss was reduced from 600 microjoules to 200 microjoules.

Accordingly, when the novel invention is applied to an IGBT device, a minimum line width can be used to maximize latch current and current density, and a larger radiation dose can be used to reduce switching loss while not increasing forward voltage drop above levels previously acceptable with a lower radiation dose and shallower increased concentration diffusion. The very deep increased conduction regions also serve as a preferred breakdown location for avalanche current under inductive loads. Since the deep increased conduction regions are uniformly distributed over the active area of the chip, avalanche current will flow uniformly and the $1^2L$ capability of the chip is substantially improved.

The novel deep increased conduction regions are also beneficially applicable to power MOSFETs and will similarly improve their current density, on-resistance and avalanche energy capability and will permit use of larger radiation doses and/or heavy metal lifetime killing to decrease $t_{rr}$ and $Q_{rr}$ of their inherent diode.

BRIEF DESCRIPTION OF THE DRAWINGS

FIG. 3 is a chart showing forward voltage drop as a function of total switching energy loss for two IGBT devices and demonstrates the reduction in total switching loss for the same forward voltage when using the ultra deep enhancement diffusion of the invention.

FIG. 8 illustrates the implant of phosphorus atoms through the windows in FIG. 7 into the exposed silicon.

FIG. 9 shows the structure of FIG. 8 following removal of the photoresist and deep diffusion of the phosphorus atoms of FIG. 8 to a depth of approximately six microns.

FIG. 10 shows the structure of FIG. 9 following the formation of an oxide layer over the surface of the device, the deposition of a photoresist over the oxide layer and the patterning of the photoresist in the second masking step.

FIG. 11 shows the structure of FIG. 10 after the etching of a second window pattern in the oxide of FIG. 10, removal of the photoresist and implant of the P+ boron.

FIG. 12 shows the structure of FIG. 11 after a short diffusion drive to drive the boron implanted in the step of FIG. 11 for a short distance and thereafter the growth of oxide over the shallow P+ regions.

FIG. 13 shows the structure of FIG. 12 following steps in which a photoresist is deposited over the surface of FIG. 12 and is appropriately patterned by a third masking step to produce the window pattern shown in FIG. 13 after the oxide exposed by the window pattern is etched away.

FIG. 14 shows the structure of FIG. 13 following the removal of photoresist, the formation of a thin oxide layer which will define the gate oxide of the device and then the deposition thereupon of polysilicon and then the formation of a photoresist layer which is photolithographically patterned in a fourth masking step as shown.

FIG. 15 shows the structure of FIG. 14 following the etching away of polysilicon and gate oxide exposed by the window pattern in FIG. 14, the stripping of the photoresist and the implant of a relatively light dose of boron into the surface areas of the silicon exposed by the window pattern.

FIG. 16 shows the structure of FIG. 15 following a body diffusion step in which the high concentration P+ regions of FIG. 15 are driven deep and at the same time the more lightly doped boron regions are less deeply driven to form a composite body which is shallower than the N+ regions.

FIG. 17 shows the structure of FIG. 16 after de-glassing and shows an arsenic implant through the same windows through which the P(−) channel regions were formed with a short drive used to form the N++ source regions of the device.

FIG. 18 shows the structure of FIG. 17 after the deposition of an interlayer oxide over the entire wafer surface and the formation of a photoresist layer over the surface which is patterned in a fifth photolithographic patterning step to form the contact mask.

DETAILED DESCRIPTION OF THE DRAWINGS

Figure 1:
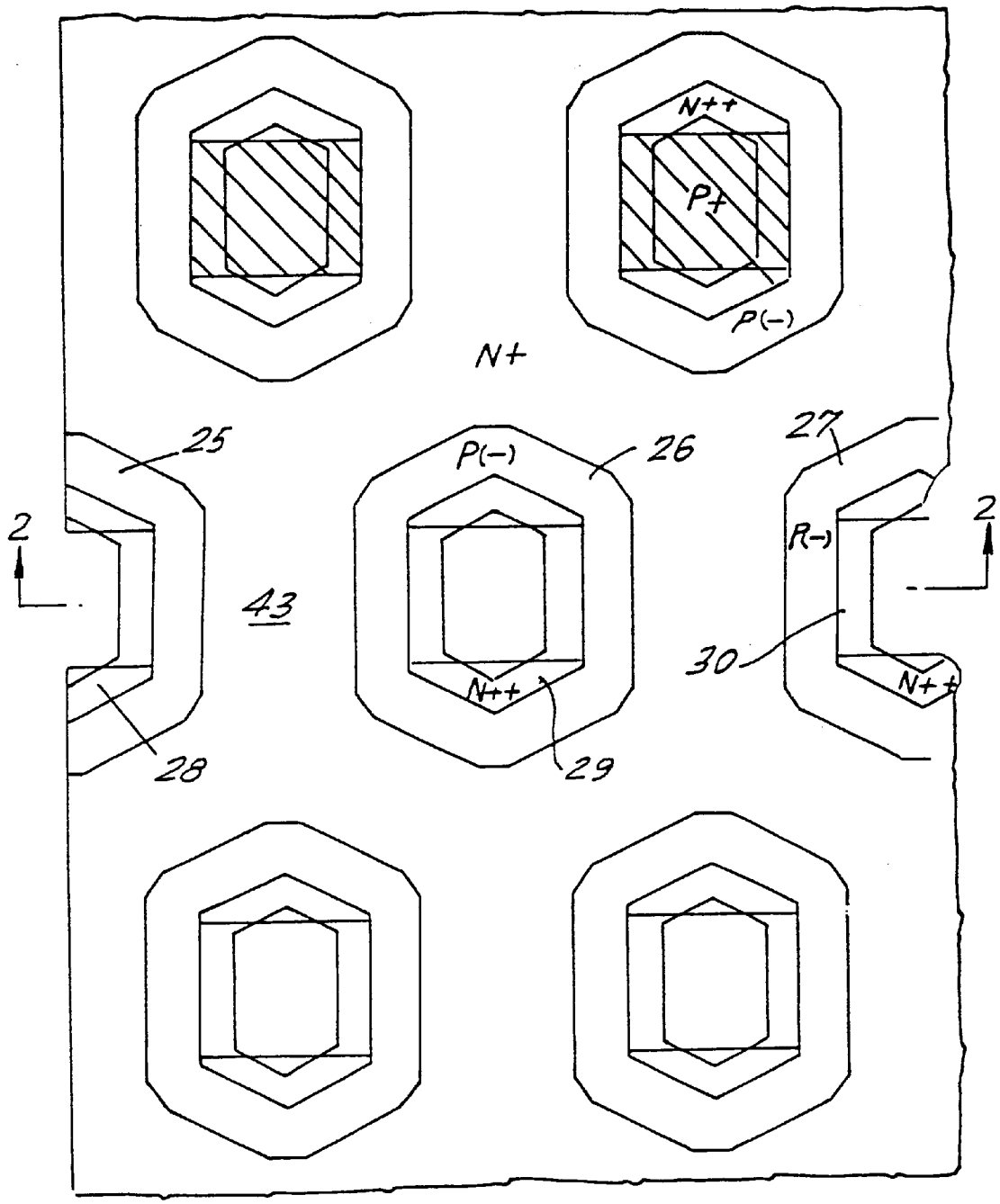
FIG. 1 is a top view of the silicon surface of a prior art IGBT device.
Figure 2:
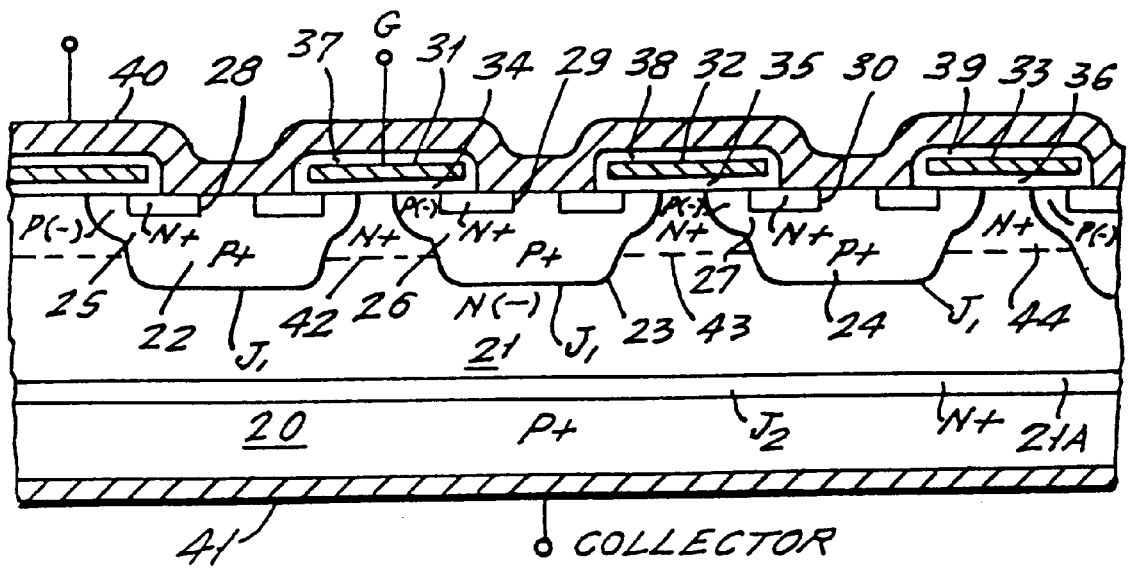
FIG. 2 is a cross-sectional view of FIG. 1 taken across the section line 2—2 in FIG. 1 and shows the cell pattern of a prior art IGBT.

FIGS. 1 and 2 show, in schematic fashion, a prior art IGBT device of the type sold by the assignee of the present invention under their device type numbers previously identified. The scale employed in FIGS. 1 and 2 is greatly enlarged, and in FIG. 2, is distorted, in order to clarify the description of the present invention. Only a few of the large number of hexagonal cells are shown in FIG. 1. Moreover, there is no disclosure of the termination structure or other surface features for the chip since they are unrelated to the present invention.

The IGBT device has a P+ substrate 20 of silicon. An N+ epitaxial region 21A is grown atop substrate 20. The junction between P+ region 20 and N+ region 21A is identified as junction J2. Atop N+ epitaxial region 21A is grown an N(−) epitaxial region 21. Cellular bases (sometimes called "body regions") are then formed into the upper surface of epitaxial layer 21 by processing techniques such as those disclosed in U.S. Pat. No. 4,593,302 dated Jun. 3, 1986, assigned to the assignee of the present invention. The three bases shown in FIG. 2 have deepened central P+ regions 22, 23 and 24 which have a relatively high concentration and are surrounded by shallower shelf-type P(−) regions sometimes called "channel" regions 25, 26 and 27, respectively. Channel regions 25, 26 and 27 have a sufficiently low concentration that they can be inverted by the application of a low threshold gate voltage to the device gate in the manner well known in MOSFET technology. The junctions between the bases and the epitaxial region 21 are identified as junctions J1. Each of the polygonal, cellular base regions then receives an annular source 28, 29 and 30, respectively, which is a high conductivity N+ source region.

A web or mesh of gate oxide extends across each of the P(−) channel regions of each base. Thus, segments of a web of silicon dioxide, shown as segments 34, 35 and 36, extend over at least the P(−) channel regions 25, 26 and 27 of each cell shown in FIG. 2. A conductive polysilicon gate is then provided atop the gate oxide web. Thus, polysilicon gate segments 31, 32 and 33 can be seen in FIG. 2 overlying oxide segments 34, 35 and 36, respectively, spanning the distance between the adjacent base regions and extending over the P(−) channel regions of each of the bases.

The polysilicon gate segments are then covered by a suitable silicon dioxide layer with segments 37, 38 and 39 of this layer being shown in FIG. 2 which encapsulate the gate segments 31, 32 and 33. The gate segments 31, 32 and 33 will be connected to an appropriate common gate pad (not shown). For purposes of illustration, a gate electrode "G" is shown connected to segment 31, it being understood that this gate electrode will be connected to all of the gate segments of the entire gate mesh.

A main emitter electrode 40 is formed over the major portion of the upper surface of the device and contacts each of the N+ source regions and the P+ base regions 22, 23 and 24 in conventional fashion. A collector electrode 41, shown in FIG. 2, is applied to the bottom of the P+ region 20.

The dopant concentration in the active region between the base cells is increased above that of the N(−) epitaxial layer 21 to a greater N+ concentration for a depth of about 3 microns which is greater than the depth of the source regions but shallower than the depth of the base regions 22, 23 and 24. The depth of the increased concentration regions is shown in FIG. 2 by the dotted lines 42, 43 and 44. Regions 42, 43 and 44 are formed by the process described in U.S. Pat. No. 4,593,302. Thus, the diffusions were formed by implanting phosphorus at a voltage of about 120 KEV and a dose of about $3.5 \times 10^{12}$ atoms/cm$^2$ and driving that implant for about 2 hours at 1175° C. These increased concentration regions were used to offset the effect of the parasitic JFET which exists between the spaced bases when they are brought close together.

By depth of the N+ regions 42, 43 and 44 into the N(−) region 21 is meant the depth at which the conductivity is measurably greater than that of the background epi. This depth is located within the range of experimental error at about the inflection point of the curve of concentration versus depth (see FIG. 21) which exists for any N+ diffusion into an N(-) background. The exact depth which is reached by this measure is not critical and it can be shown that the vast bulk of the added charge (at least 97%) exists between the silicon surface and the defined depth of the deep diffused implant. Note that the increased concentration value will be greater toward the top of the epitaxial layer 21 and will decrease with depth into the layer 21 until the background concentration of layer 21 is reached. This definition of depth of an N+ diffusion into an N type background shall be used throughout this application.

The chip of FIGS. 1 and 2 was exposed to an electron flux or radiation dose of about 8 megarads to reduce lifetime and to increase switching speed and thus decrease switching loss. The radiated device had a fall time of about 300 nanoseconds and a turn-off switching loss of about 600 microjoules.

The operation of the IGBT device shown in FIGS. 1 and 2 is as follows:

When a negative bias is applied to the collector electrode 41 with respect to the emitter electrode 40, current flow is blocked because the emitter-base junction J2 of the PNP transistor formed by P+ region 20, N regions 21, 21A and P regions 22, 25, 23, 26 and 24, 27 becomes reverse-biased. This provides the device with its main reverse blocking capability.

When a positive voltage is applied to the collector 41 relative to the emitter 40 and the gate electrode segments 31, 32, 33 are shorted to the source 40, the collector-base junctions J1 of the above-described PNP transistor are reverse-biased so that the device will operate in a forward-blocking mode. If now a positive gate voltage of sufficient magnitude is applied to the gate segments 31, 32 and 33 and the channel regions 25, 26 and 27 invert, electrons can flow from the N+ source regions 28, 29 and 30 to the N(-) base region 21. The device then switches on to its forward conducting state. While in this forward conducting state, the emitter-base junction J2 becomes forward-biased and the region 20 injects holes into the low concentration N(-) base region 21. The device then turns on to carry current in the manner of a bipolar power transistor having extremely high current density in comparison to the lower current density available in a comparable power MOSFET.

In order to turn the device off, it is only necessary to remove the gate bias from the gate segments 31, 32 and 33. This removes the inversion regions at P(-) channel regions 25, 26 and 27 and shuts off the supply of electrons to the N(-) base 21 and initiates the turn-off process.

As pointed out previously, electron radiation is used to increase switching speed. While a greater dose than 8 megarads is desirable, additional radiation increases the forward voltage drop to unacceptable levels. Moreover, heavy metal doping, which is preferable to radiation, cannot be used because it increases the apparent resistivity of the regions between bases which increases the effect of the parasitic JFET, increasing the forward voltage drop to an even greater extent than that expected from the effect of the increased irradiation.

The device described above in FIGS. 1 and 2 contains a parasitic NPNP thyristor consisting, for one cell by way of example, of N+ source 29, P body 23, 26, N base 21, 21A and P+ anode region 20. If this parasitic thyristor latches on during operation of the device, removal of gate bias will not cause the device to turn-off. This phenomenon is known as "latch-up" in power IGBTs. The latch-up phenomenon is, of course, extremely undesirable and a successful IGBT design is one in which the latch-up current is higher than any current which is expected to flow during device operation.

In order to increase the current at which latch-up occurs, it is known that the poly line width or, more specifically, the space between adjacent cellular bases, should be reduced. Reducing the poly line width, however, increases the effect of the parasitic JFET between the spaced cells of the device which increases the forward voltage drop and thus reduces the current rating of the device.

The poly line width can be reduced if additional charge is added to the active N+ regions 42, 43 and 44 between the cellular base structures. However, in the prior art devices of FIGS. 1 and 2, regions 42, 43 and 44 used the same depth of about 3 microns which was used in HEXFET power MOSFETs made by applicants' assignee. This was done intentionally to avoid making regions 42, 43 and 44 deeper than the base. However, it has now been found that this depth is too shallow for optimum IGBT operation and, further, if its depth is made greater than that of the deep base, a large number of unexpected advantages are produced; namely, the bases can be more closely spaced together, the latch current is increased, a higher radiation dose or heavy metal lifetime killing can be used, switching speed can be increased without increasing forward voltage drop above previous levels and avalanche energy is increased.

FIG. 3 shows the total switching energy losses vs. forward voltage drop of the IGBT of FIGS. 1 and 2 having a reverse blocking voltage of 600 volts, with the shallow implants 42, 43, and 44 in comparison to an equivalent IGBT which uses the present disclosed invention. It will be seen, that for radiation levels significantly greater than zero, there is a greater than 50% improvement in switching losses at the same forward voltage drop when using the very deep increased concentration diffusion. As will be later described, the present invention provides a major improvement in reduction of switching energy loss as a function of forward voltage drop as a result of the ability to use an increased lifetime killing.

Figure 3A:
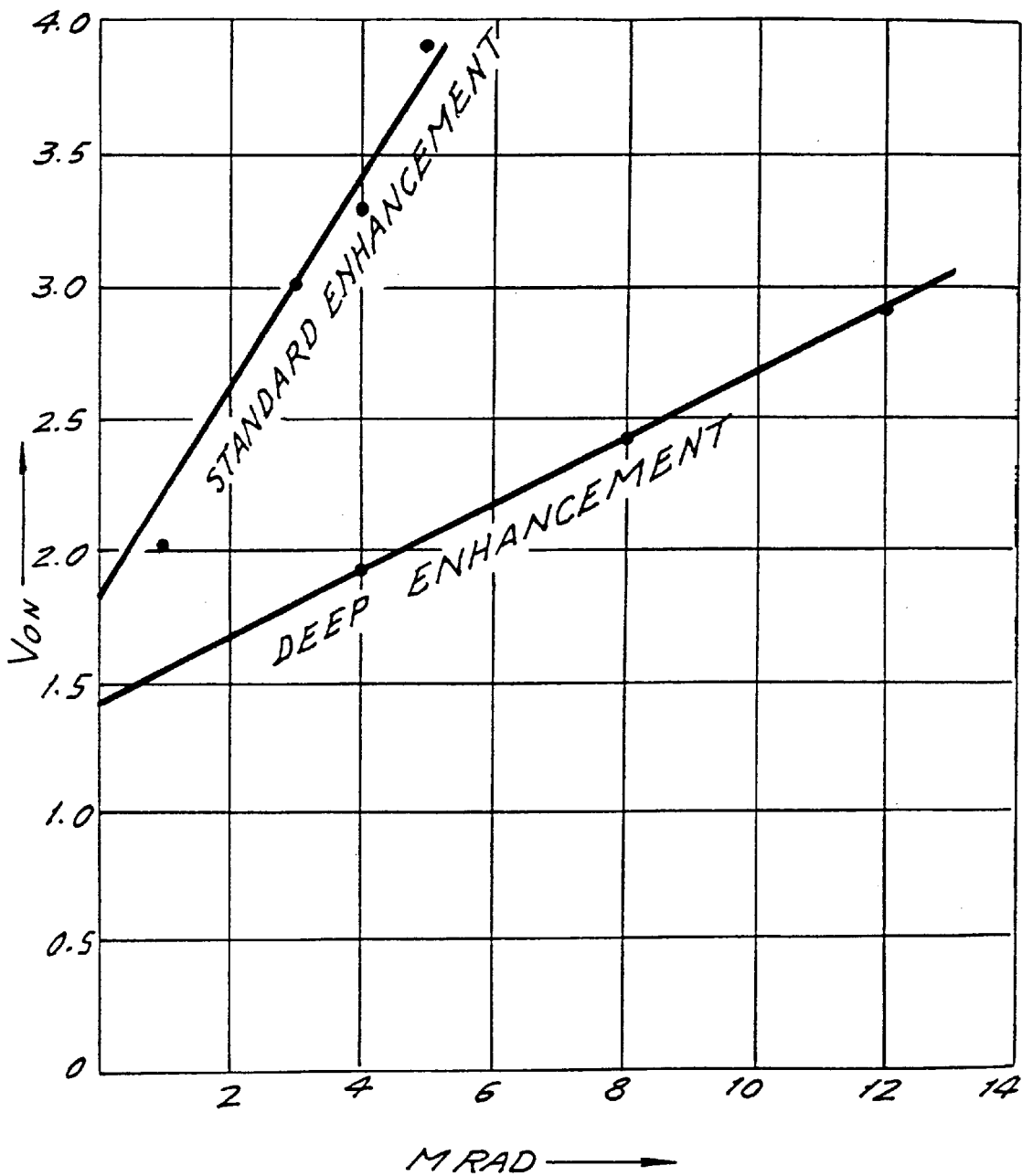
FIG. 3a shows forward voltage drop versus radiation dose for two devices which have higher blocking voltages than that of the devices of FIG. 3.

FIG. 3a shows the forward voltage drop Von versus radiation dose for two, 1200 volt devices, one with the prior art shallow implant and the other with the deeper driven implant of the invention. The data on the curve of FIG. 3a were measured for a forward current of 10 amperes at 25° C. on a device in which the N(-) region 21 was 85 ohm centimeters and 95 microns thick and in which the N+ region 21A was 0.04 ohm centimeter and 7.5 microns thick. The device labeled "deep enhancement" had deep N+ regions such as regions 60, 61 and 62, shown in FIG. 19. FIG. 3a clearly demonstrates that the deeper implant enables a higher radiation dose (to reduce switching loss) without unduly increasing forward voltage drop. Note also that the benefits of the invention become more important as blocking voltage increases.

Figure 19:
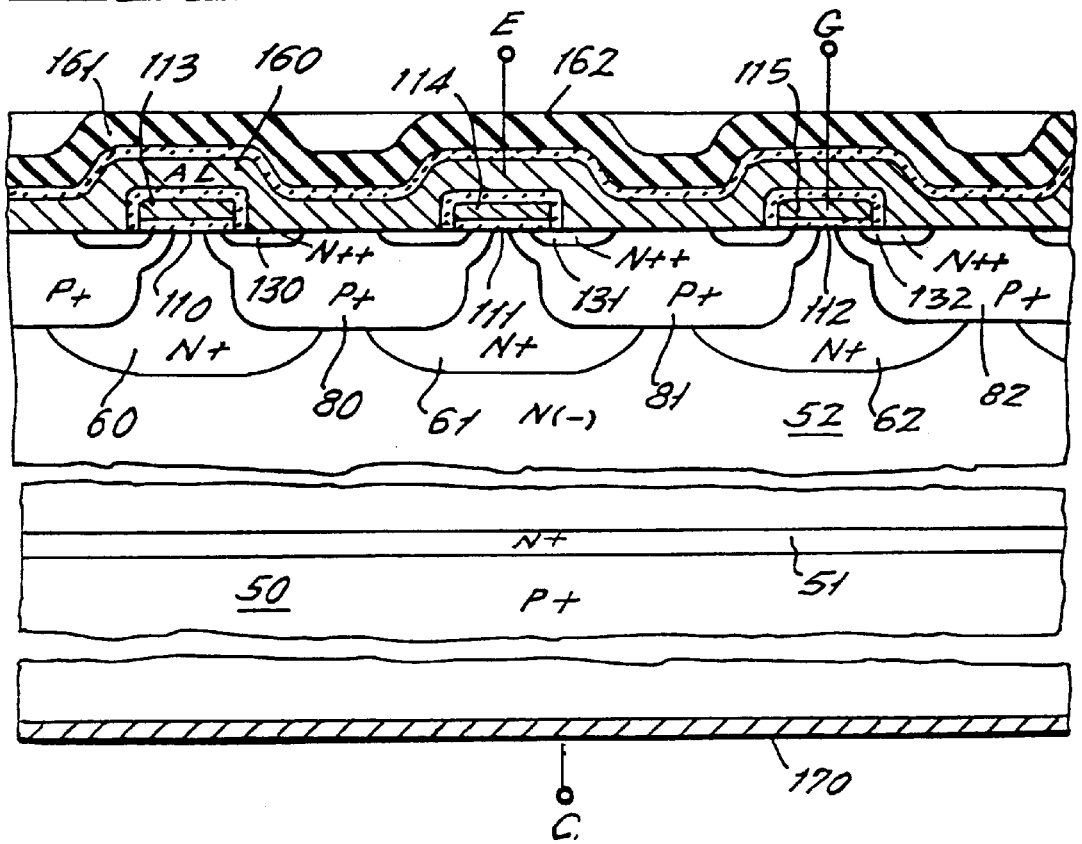
FIG. 19 shows the complete wafer of FIG. 18 after the etching away of all oxide exposed through the windows of the mask in FIG. 18, the stripping of the photoresist and the application of an aluminum layer, an amorphous silicon layer and a photopolyimide layer.

FIGS. 4 through 19 describe the manufacture of a preferred embodiment of the present invention with FIG. 19 showing the ultimately completed junction pattern. The figures are not to scale but have been greatly exaggerated for purposes of clarity. Further, the figures show only a few of the thousands of identical cells on a single chip. Moreover, the important peripheral structure of the chip is not shown since it is unrelated to the present invention. As will be further described, the novel invention removes some of the responsibility of the peripheral structures for improvement of avalanche energy capability of the device.

Figure 4:
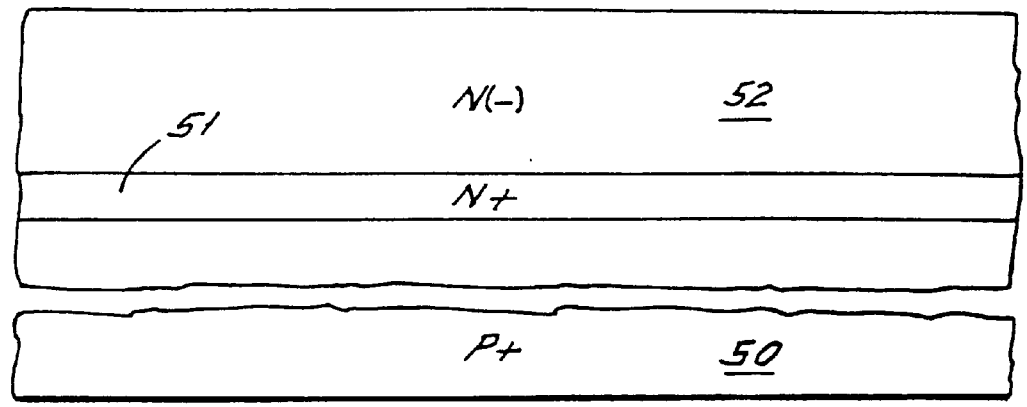
FIG. 4 is a cross-sectional view of the starting wafer for the manufacture of an IGBT in accordance with the present invention.

Referring first to FIG. 4, a small portion of the starting wafer of silicon is disclosed. The wafer has flat parallel upper and lower surfaces and has a substrate 50 of boron doped P+ material having a thickness for example of 15 mils. The P+ material is doped to a resistivity of less than about 0.02 ohm centimeter. A thin epitaxially grown N+ layer 51 is grown atop the P+ substrate 50 to a thickness of about 7 microns and, for a 600 volt IGBT device, has a resistivity of about 0.05 ohm centimeter. The N+ region 51 would be thicker and more heavily doped for higher voltage rated devices. For example, for a 1200 volt device, region 51 could have a thickness from 8 to 9 microns and a resistivity of 0.035 ohm centimeter. For a much lower voltage device, for example, 300 volts, region 51 may be eliminated. Region 51 could also be a region which is diffused into substrate 50 or could be formed by direct wafer bonding.

A second epitaxial layer which defines the main voltage blocking region of the device is the N(-) layer 52. All diffused junctions are formed in this epitaxially formed region 52. Its thickness for a typical 600 volt IGBT device is about 60 microns with a resistivity of about 30 ohm centimeters. Typically, layer 52 is doped with phosphorus. A thicker and higher resistivity material would be used for higher voltages. For example, for a 1200 volt device, region 52 would have a thickness of about 100 microns and a resistivity of about 85 ohm centimeters. For a 300 volt device, region 52 will have a thickness of about 35 microns and a resistivity of about 7 ohm centimeters. Those skilled in the art will understand that the thicknesses and resistivities of regions 51 and 52 can be appropriately adjusted relative to one another for different voltage ratings.

Figure 5:
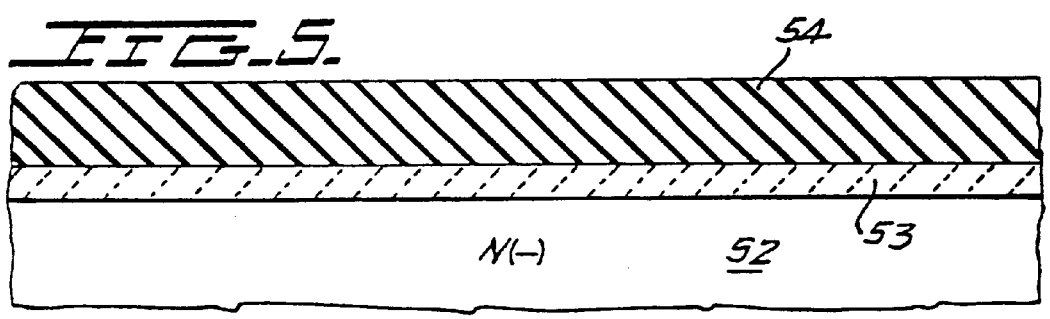
FIG. 5 shows the portion of the wafer of FIG. 4 after the deposition of an initial coating of protective oxide and a photoresist.
Figure 7:
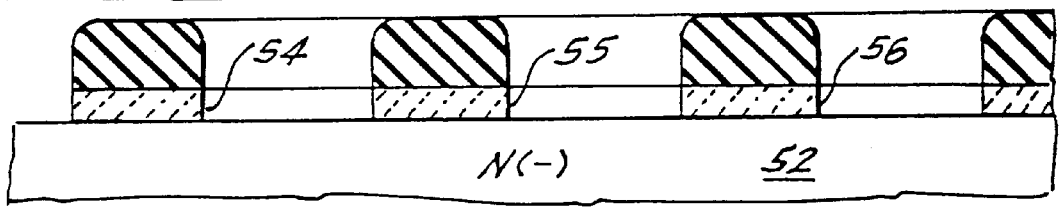
FIG. 7 is a cross-sectional view of FIG. 6 taken across the section line 7—7 in FIG. 6.
Figure 6:
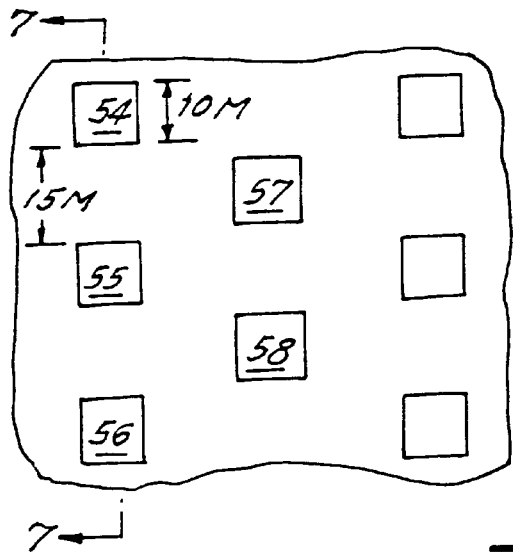
FIG. 6 shows the topology of the surface of the structure of FIG. 5 after the etch of the first window pattern to prepare the structure for the implant of the future ultra deep increased concentration region.

The first processing step on the wafer of FIG. 4 is shown in FIG. 5 as the formation of an oxide layer 53 to a thickness of about 400 angstroms. A conventional photoresist 54 is applied to the top surface of oxide layer 53 and is patterned to the mesh-type pattern shown in FIG. 7. The oxide layer 53 is etched away within the window pattern. This results is the formation of a plurality of rectangular oxide islands 54 through 58 shown in FIG. 6 and partly in FIG. 7.

The preferred embodiment of the invention employs a hexagonal cell topology. Clearly, however, the invention will be equally applicable to any desired surface topology including square cells, offset square cells, interdigitated fingers and the like. It will be further noted that the hexagonal cell configuration used in this preferred embodiment is not a symmetrical hexagon with all sides of equal dimension but instead the cells are slightly elongated in the lateral direction so that the lateral distance from tip to tip of any of the cells is about 20 microns while the distance between flats in a vertical direction is about 16 microns. A symmetrical hexagonal pattern could also be used. In the preferred embodiment shown in FIGS. 6 and 7, the center to center distance in a vertical direction between oxide islands 54 and 55 is 25 microns. The center-to-center distance between columns of oxide islands is about 22 microns.

As next shown in FIG. 8, phosphorus is implanted into the silicon through the window pattern formed by the first photolithographic-oxide etch step. The photoresist itself acts as the mask to the implanted atoms. N+ phosphorus regions 60, 61 and 62 are segments of a mesh pattern shown in FIG. 6. In the preferred embodiment of the invention, the phosphorus implant is carried out at an accelerating energy, for example, of 120 kev and has a preferred dose of about 3.5 E12. The dose can range between about 2 E12 and 7 E12. The limitations on the dose are that it should not be so high that it reduces the reverse voltage breakdown beyond acceptable limits, but should be high enough to have a significant impact on the parasitic JFET along its full length.

The implant of FIG. 8, after stripping the photoresist, is next driven deep below the surface of region 52. In the preferred embodiment of the invention, the implants 60, 61 and 62 are initially driven at a temperature of about 1175° C. for 8 hours. A higher temperature can be used to reduce the drive time. For example, at 1200° C. the drive can be reduced to about 4 hours. This important drive is carried out in nitrogen in order to prevent the growth of silicon dioxide during the drive. During this initial drive of carriers to form regions 60, 61 and 62, the regions will go about 6 microns deep, almost their full ultimate depth. As will be later seen, there will be about 2 more hours of subsequent processing drives which will increase the depth of these regions by approximately 1 micron.

Figure 21:
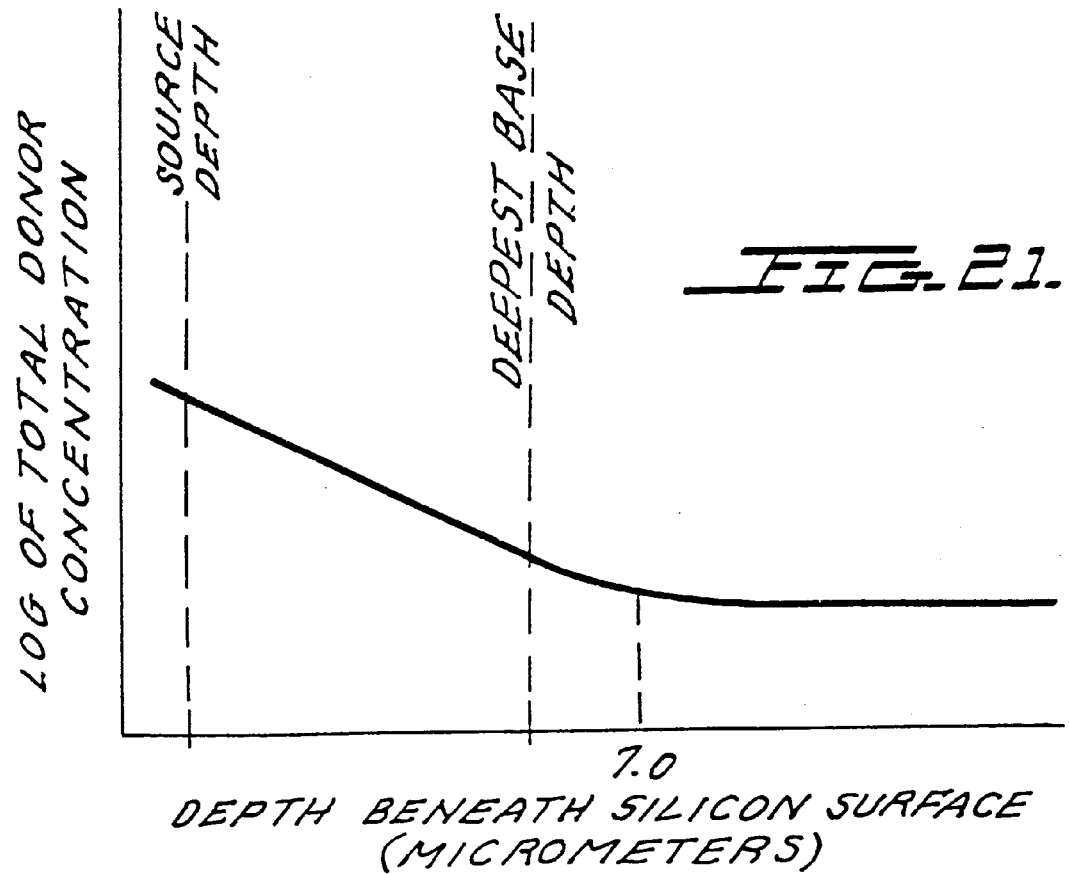
FIG. 21 is a diagram showing the method by which the depth of an N+ region into an N(−) epitaxial background is measured.

In order to measure the depth of additional N type carriers into an N type background, it is convenient to consider the shape of the curve of the log of total donor concentration in region 52 of FIG. 9 as a function of depth beneath the silicon surface, as shown in FIG. 21. This curve can be created either by direct experimental techniques using a spreading resistance probe on large area diffusions or can be computer-simulated. The inflection point in the curve of FIG. 21 occurs at the depth at which the concentration levels out to approximately that of the initial background of the epitaxial material 52 and is a measure of the depth of the increased concentration region. In the example of the curve of FIG. 21, the inflection point occurs at approximately 7.0 micrometers. It can be shown that more than 97% of the total charge added by implants 60, 61 and 62 is contained to the left of (above) the 7.0 micron depth. As will be later described and in accordance with the invention, this depth of the increased concentration regions is greater than the well-defined base depth which is a PN junction and, therefore, can be precisely located within the silicon.

As also shown in FIG. 9, regions 61, 62 and 63 diffuse laterally as they drive deeper. These regions will laterally diffuse until regions 60, 61 and 62 will almost meet at the center of the oxide regions 54 through 56. They obviously will not meet and will be somewhat spaced apart at their full vertical depth as shown in FIG. 9. Whether or not these regions meet at the center or are spaced or overlap is of little consequence to the invention.

It should be further noted that the N+ regions such as regions 60, 61 and 62 do not extend to the periphery of the chip but exist only within the active cell region of the chip. The increased concentration regions cannot extend beyond the active region of the chip and into the junction termination area (not shown) since they will reduce device breakdown voltage.

FIG. 10 shows the next step in the process in which an oxide layer 70 is grown atop the surface of the wafer of FIG. 9 to a thickness of about 8,000 angstroms. A photoresist layer 71 is deposited atop the oxide layer 70 and is then appropriately patterned, as shown in FIG. 10 to define windows which are, in fact, hexagonal openings which expose the regions above oxide islands 54, 55 and 56. The oxide 70 and the underlying oxide dots 54, 55 and 56 are then etched through the spaced windows in photoresist 71 to expose the silicon surface, as shown in FIG. 11. Thereafter, the photoresist is removed and a heavy boron dose is implanted into the exposed silicon surface areas, as shown at regions 80, 81 and 82 in FIG. 11. The boron implant in FIG. 11 is carried out at an acceleration voltage of about 50 kev with a dose of about 3 E15. A high dose is preferred since the implant regions 80, 81 and 82 are ultimately deepened to become P+ base regions which have a high conductivity to produce a relatively low $R_b'$ beneath the source of the MOSFET portion of the device. A low $R_b'$ will produce a large latch current. The dose used for the boron implant in FIG. 11 should be as high as possible. However, the dose should be lower than the value at which silicon damage begins or overall device performance is diminished.

Following the implant step of FIG. 11, there is a short initial drive of the implant in dry nitrogen plus 1% oxygen in order to obtain an initial drive of 1–2 micrometers. This initial drive for the P+ regions 80, 81 and 82 is shown in FIG. 12. Thereafter, oxide segments 83, 84 and 85 are grown over the P+ regions 80, 81 and 82. Note that the boron regions 80, 81 and 82 were initially driven for a short depth to avoid a substantial depletion of the surface boron during the growth of the oxide segments 83, 84 and 85.

Thereafter, and as shown in FIG. 13, a photoresist layer 90 is deposited atop the surface of FIG. 12 and is patterned to define a third window pattern by which all oxide except that overlying the P+ regions 80, 81 and 82 is etched away.

Thereafter, as shown in FIG. 14, the photoresist layer 90 is removed and a thin gate oxide layer 95 is grown over the fully exposed active area of the wafer. The gate oxide 95 has a thickness of about 1050 angstroms. A polysilicon layer 96 is then deposited atop the wafer to a thickness of 4,000–5,000 angstroms. Although not shown, a thin (500 angstrom) oxide layer is grown atop the polysilicon layer 96 to promote adherence of the photoresist layer 97 which is deposited atop the polysilicon 96. The photoresist 97 is then patterned according to the fourth masking step forming hexagonal openings 98, 99 and 100, which enclose P type regions 80, 81 and 82, respectively.

Thereafter, the thin oxide layer over the polysilicon is etched to the pattern of windows 98, 99 and 100, the photoresist is stripped and the so-etched thin oxide layer is used as a mask to etch the polysilicon, forming hexagonal windows above the gate oxide layer 95. Thereafter, the gate oxide layer is etched which also removes the thin oxide layer (not shown) on top of the polysilicon layer. As shown in FIG. 15, this exposes the remaining polysilicon web and the surface of the silicon substrate 52 inside the windows 98, 99 and 100. Note that this photolithograph-etch step leaves in place oxide islands (slightly diminished in thickness) 83, 84 and 85, as well as the hexagonally shaped grid represented by gate oxide and polysilicon segments respectively 110, 111, 112 and 113, 114, 115.

Thereafter, and as further shown in FIG. 15, boron is implanted into the surface of the wafer and, in particular, through the hexagonal diffusion windows 98, 99 and 100. The boron dose in this operation is 1E14 at 50 kev, much lower than that of the boron dose in FIG. 11 (3E15). This 1E14 boron dose after diffusion will merge with the higher-dose boron region and will form a low concentration P(–) type channel region which surrounds and is shallower than the P+ body portion produced from the higher concentration regions 80, 81 and 82. Thus, lighter doped boron regions 120, 121 and 122 are formed in FIG. 15. These regions are then driven for about 2 hours at 1175° C. to reach a depth of about 4.5 microns. Regions 120, 121 and 122 which are annular regions, are shown partly in dotted line in FIG. 16, although it is obvious that where these regions overlap the P+ regions 80, 81 and 82 they merge with one another.

The P(–) shallow "shelves" 120, 121 and 122 which surround deep P+ regions 80, 81 and 82 are lightly doped channel regions extending beneath the gate oxide. These lightly doped regions, along with the deep P+ body regions after diffusion, define a roughly square cross-section for each cell as compared to the inverted head and shoulders cross-section used in the prior art and as shown is U.S. Pat. No. 4,593,302. The more square pattern is produced because manufacturing tolerances have improved to the point where the shallow P(–) regions can be very accurately defined and the P+ regions can be made relatively wider, thus reducing $R_b'$ as much as possible, without adversely encroaching into the channel region.

It will be noted that, in each drive including the P(–) drive in FIG. 16, all junctions continue to move deeper. The N+ regions 60, 61 and 62 move to a lesser degree and P+ regions 80, 81 and 82 move to a somewhat larger degree. It is also obvious to those skilled in the art that as the diffusions drive deeper they also move laterally, whereby the shallow diffusions 130, 131 and 132 ultimately diffuse under the gate oxide.

The surface of the structure of FIG. 16 is then appropriately de-glassed and a source implant step is carried out, as shown in FIG. 17. Thus, arsenic atoms at 50 kev are implanted through windows 98, 99 and 100 at a dose of 3 E15. The source implant is then annealed and driven in at a temperature of 975° C. for approximately 120 minutes to form the annular N++ source regions 130, 131 and 132. The space between the N++ source and the portion of junction J1 formed by the shallow P(–) region form invertible channel regions beneath the previously formed gate oxide.

The source regions could also have been formed through the use of phosphorus, but the arsenic implant is preferred since phosphorus would be driven deeper and would, therefore, increase $R_b'$.

Thereafter, and as shown in FIG. 18, an interlayer silicon dioxide coating 140 having a thickness of approximately 10,000 angstroms is formed over the surface of the chip and the surface is then coated with photoresist layer 150 which is photolithographically patterned to define the contact mask opening, as shown in FIG. 18. These window openings are local, generally hexagonal openings in the photoresist 150. The surface exposed through the openings in the photoresist is then appropriately etched to expose the underlying inner peripheral portions of the N++ sources and the central body of the P+ regions 80, 81 and 82. After removing the photoresist, a hexagonal grid of interlayer oxide remains over the polysilicon segments 113, 114 and 115 to insulate these segments from a subsequently deposited aluminum layer, as shown in FIG. 19. The aluminum layer is then photolithographically patterned and etched to form source and gate electrodes (not shown).

The aluminum emitter electrode 160 is a continuous electrode, which electrically connects each cell in parallel and shorts each of the P+ body regions and the inner periphery of their respective annular N++ source regions. An amorphous silicon layer 161 is deposited over the surface of the wafer and is, in turn, covered by a thin photopolyimide layer 162.

The photopolyimide layer 162 is then appropriately photolithographically patterned and the amorphous silicon layer etched (not shown) to expose appropriate emitter and gate pads. During this operation, the amorphous silicon may be etched with a suitable plasma etch. The polyimide layer 162 is then imidized as by heating at between 400–500° C.

Thereafter, the device of FIG. 19 has material removed from its bottom surface, for example as by grinding 2–3 mils of silicon from the bottom of the P+ layer 50. The grinding operation could be replaced by an appropriate etch or sand blast. A suitable collector electrode 170 is then attached to the bottom surface, as shown in FIG. 19, and can be a conventional chrome nickel silver tri-metal.

This completes the manufacture of the wafer containing the discrete IGBT die. The wafer may then be placed in a suitable electron irradiation apparatus and, in accordance with the invention, irradiated to a 16 megarad total dose. This is about twice the dose which was used in prior art IGBTs. After radiation, the wafer is annealed at 300° C. for about 30 minutes. The increased dose is made possible because of the extremely deep N+ drain enhancement diffusions 60, 61 and 62 which prevent an excessive increase in forward voltage drop of the device due to reduced lifetime. That is, the N+ regions 60, 61 and 62 have locally decreased the need for conductivity modulation to reduce the resistance in the JFET regions of closely spaced bases. By increasing the dose to 16 megarads, it has been found that the fall time of the ultimately formed IGBT device is reduced from about 300 nanoseconds to about 100 nanoseconds with the turn-off switching loss being reduced from about 600 microjoules to about 200 microjoules. As a result, and as shown in FIG. 3, the IGBT of FIG. 19 has the characteristics shown in the bottom curve labelled IGBT with deep enhancement. It will be seen that, for increased lifetime killing, switching energy loss is substantially reduced for any given forward voltage drop. Thus, devices using the features of the present invention can either be operated at higher frequencies or can be operated at the same frequency as a prior art device with a substantially reduced forward voltage drop. Obviously, any combination of these two improvements can also be targeted.

Radiation doses higher than 16 megarads would be desirable, but it has been found that a switchback characteristic is produced in the forward conduction characteristic of the device at radiation doses which approach about 20 megarads. It is believed that the switchback characteristic may be undesirable. If it is, in fact, undesirable, the dose used should be lower than about 20 megarads.

The present invention also makes it possible to use heavy metal doping to kill lifetime in place of irradiation. Heavy metal doping is preferred to radiation since the lifetime killing effect of radiation can anneal out at die bond temperatures. This is not true of heavy metal doping which remains constant through die bond. However, heavy metal lifetime killing increases the apparent resistivity of the silicon and thus increases the resistivity between bases which would, in turn, increase the efficiency of the parasitic JFET and thus cause unacceptable increases in forward voltage drop. In the case of the present invention, this drawback of heavy metal doping is overcome by the use of the extremely deep diffusions 60, 61 and 62, which are deeper than the deepest portion of the base. Thus, in accordance with a further feature of the invention, heavy metal doping can be diffused into the wafer prior to the deposition of the aluminum source electrode 160 in FIG. 19.

The IGBT device of FIG. 19 is designed so that the N(−) layer 52 is fully depleted during turn-off, with the depletion region extending into, but not through, the N+ region 51. This is desirable because holes within the N(−) region 52 will be swept into the collector region as the depletion region sweeps downwardly. The remaining holes in the N+ region will have the lowest lifetime of the N type region, therefore recombining at a much greater rate, thus turning off the device faster. The designer can ensure the full depletion of region 52 by proper adjustment of the thickness and resistivity of the epitaxial region 52.

Another feature of the present invention is that the deep N+ regions 60, 61 and 62, which are, in fact, segments of a deep diffused, increased concentration grid, are uniformly distributed throughout the active region of the device and will act as preferred points of avalanche breakdown. These deep regions will tend to reduce the total breakdown voltage of the device (which it would have in the absence of these deep regions) by about 50 volts, but in exchange they distribute avalanche breakdown current over the full area of the chip. By distributing avalanche breakdown current over the full chip area and removing it from just a few localized points on the periphery of the chip, the ability of the device to handle inductive loads (its $I^2L$ capability) is substantially increased.

While these deep regions 60, 61 and 62 are shown in connection with an IGBT in FIG. 19, it will be obvious to those skilled in the art that the same deep regions could also be used in a power MOSFET which would be the same structure as that of FIG. 19 but without the P+ region 50 and would produce the same important benefits in the increase of the avalanche energy of the device. It will also be noted that the increased lifetime killing obtained with the 16 megarad dose will also lower the gain of the PNP transistor in FIG. 19 (the transistor formed by P region 50, N regions 51, 52 and the P regions 80, 81 and 82) which also improves the $I^2L$ capability of the IGBT device.

A further important aspect of the invention is that the short circuit withstand time has been about doubled when using the very deep N+ diffusions 60, 61 and 62. The short circuit withstand time is the time which the device can stand a short circuit without failure. It is believed that short circuit withstand time has been increased because the gain of the PNP bipolar transistor was substantially reduced by the increased radiation dose made possible by the deep enhancement diffusion, thereby lowering the saturation current of the IGBT for a given gate drive. This, in turn, lowers power dissipation during short circuit conditions.

As pointed out previously, the deep enhancement diffusions 60, 61 and 62 in FIG. 19 will lower the gain of the PNP transistor formed of P region 50, N regions 51, 52 and the P regions 80,120, 81,121 and 82,122. This lowering of the gain is localized to the regions between the spaced bases. Thus, holes from the emitter base junction of the PNP transistor will be deflected toward the higher gain center of the P wells 80, 81 and 82 and away from the common conduction regions which are filled with the increased concentration regions 60, 61 and 62. Regions 60, 61 and 62 also have a lower lifetime and, therefore, higher recombination rates due to the higher concentration of impurities. In addition, the concentration gradient in the N+ diffusion will tend to deflect holes away from the N+ region due to the built in electric field it causes. All of these effects produce a higher latch current. That is, it is undesirable to have holes collected at the vertical side walls of the P bases 80,120, 81,121 and 82,122 because this produces current flow under the sources and through the resistor $R_b'$. If the enhancement regions 60, 61 and 62 were shallow then holes could readily reach the lower portions of the vertical walls of the P wells 80,120, 81,121 and 82,122, as in the prior art structure. With the extremely deep enhancement diffusion, however, many fewer holes will reach the device side walls.

Figure 20:
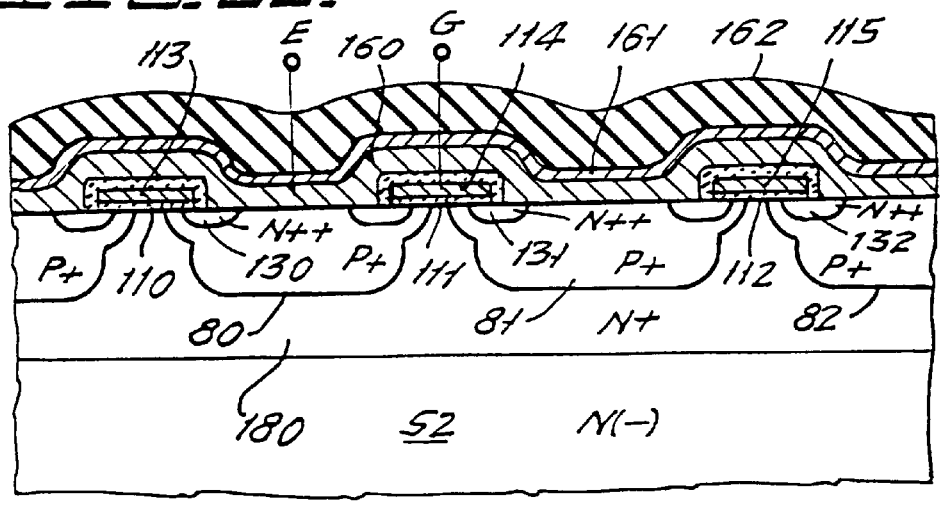
FIG. 20 is a cross-sectional view of a second embodiment of the invention in which the deep N+ regions extend to a common plane.

A second embodiment of the invention is shown in FIG. 20. Referring to FIG. 20, components similar to those described in FIG. 19 have similar identifying numerals. The embodiment of FIG. 20 differs from that of FIG. 19 only in that the N+ region 180 is a solid well diffusion with a relatively constant depth of approximately 7.0 microns. Thus, a constant depth N+ region 180 replaces the grid of deepened N+ regions represented by segments 60, 61 and 62 in FIG. 19. It should be noted that region 180 is a planar junction and terminates on the upper surface of the chip in regions not shown in the drawings.

In the manufacture of the device of FIG. 20, a uniform blanket implant over the active regions of the die of 3.5× $10^{12}$ phosphorus would first be applied to the bare silicon surface (not including the termination area). This blanket implant would then be driven to an approximate 6 micron depth. Thereafter, the processing steps shown in FIGS. 9 through 19 would follow to produce the device of FIG. 20.

In the above description, the invention has been described for an N channel device. It will be apparent to those skilled in the art that the device could just as well have been a P channel device with appropriate process modifications and all conductivity regions reversed.

As stated previously, the invention can apply to any topology. Thus, by spaced base regions is meant any geometry in which there are either totally isolated base cells, totally isolated strips of interdigitated bases or a single elongated base which traverses a sinuous path, such that a cross-section shows spaced base segments of the single base.

Figure 22:
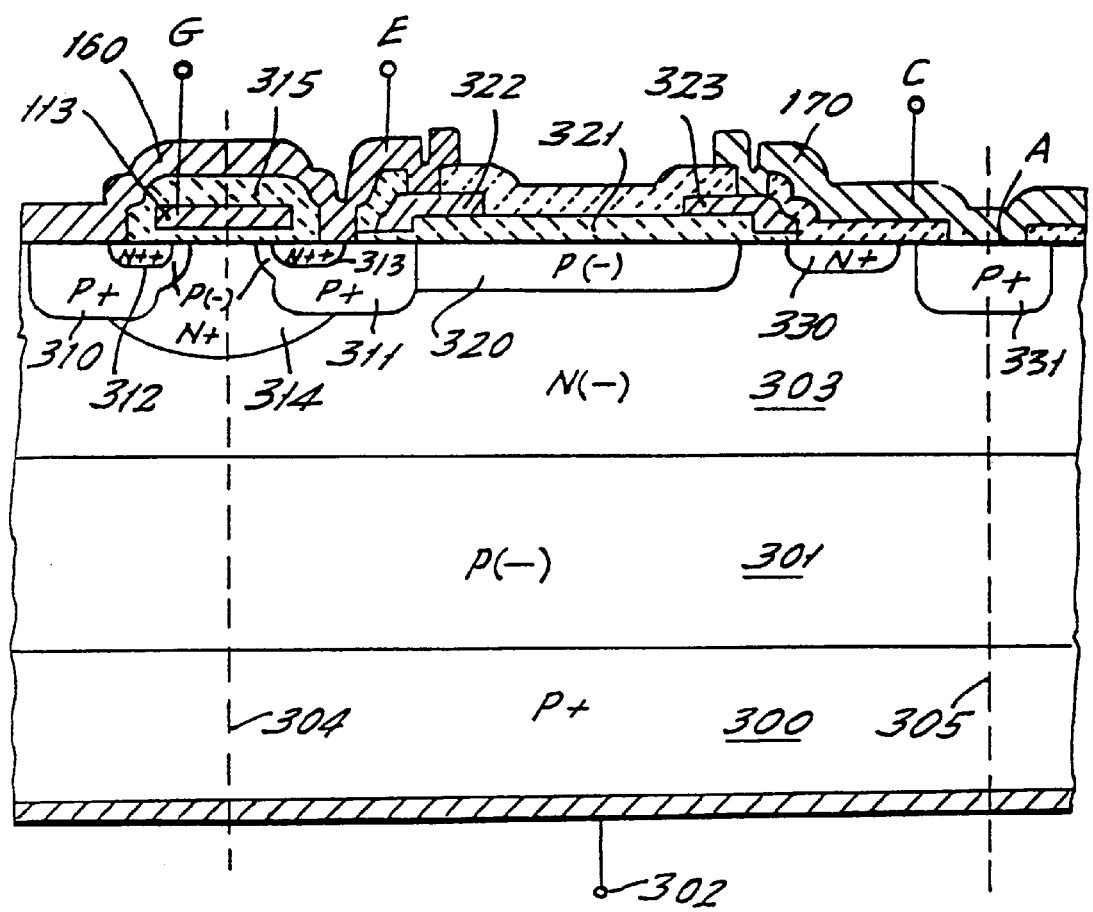
FIG. 22 is a diagram of a further embodiment of the invention with both emitter and collector electrodes on the same surface.

FIG. 22 shows a lateral IGBT embodiment of the invention in which the emitter electrode 160, collector electrode 170 and gate electrode 113 are all on the upper surface of the die. In addition a trimetal electrode 302 is formed on the back side of the P+ substrate 300 and is connected, as by a wire bond (not shown), to the emitter electrode 160 on the top of the chip. The device is constructed on starting material which consists of a P+ substrate 300. A P(−) epitaxial layer 301 and an N(−) epitaxial layer 303 are sequentially grown on top of P+ substrate 300.

The junctions formed in epitaxial layer 303 may have any desired topology and are shown as interdigitated. FIG. 22 shows a cross-section through the centers of two fingers of the topology, each finger centered around dotted lines 304 and 305, respectively.

Referring first to the emitter structure, there are two spaced base regions 310 and 311 which receive source regions 312 and 313, respectively. The ultra deep increased concentration region is shown as region 314 interposed between and deeper than spaced base regions 310 and 311. The channels defined by the P(−) regions extending from the P+ bases are overlaid by gate oxide and the gate electrode 113. An oxide (silox) layer 315 covers gate 113 and insulates it from aluminum emitter electrode 160.

FIG. 22 also shows the termination structure for the right-hand side of the strips centered on line 304 as including a resurf P(−) region 320 which is covered by field oxide layer 321. Stepped polysilicon field plates 322 and 323 are disposed as shown. Field plate 322 contacts electrode 160 and controls the surface field at the edge of P+ region 311. Field plate 323 contacts collector electrode 170 and terminates the right-hand side of resurf region 320 and one side of the floating N+ region 330.

On the collector side of FIG. 22, P+ region 331 is provided to complete the main PNP transistor, and corresponds, in function, to region 50 of FIG. 19. The collector electrode 170 is connected to region 331.

It will be noted that in the lateral IGBT device of FIG. 22, the FET portion is lateral in operation, while the bipolar transistor has both lateral current conduction to emitter 160 as well as some vertical current conduction to electrode 302.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of manufacture of a power semiconductor device comprising the steps of:

forming a first window mask on the surface of a semiconductor chip which is of the first conductivity type and applying carriers of said first conductivity type to the exposed surface of said chip and diffusing said carriers to a first depth into said substrate to form regions of increased conduction; the side boundaries of said regions of increased conduction side diffusing toward one another to boundary positions which are at least close to one another;

forming a second window mask which overlies and is centered on the boundaries between said regions of increased conduction and applying a first given concentration of carriers of the second conductivity type to said chip surface through said second window mask;

forming a gate dielectric and a conductive gate electrode over at least portions of the surface of said regions of increased conduction;

forming a third window mask which surrounds and is at least adjacent to the locations of respective ones of said second window mask and which is bounded by respective areas of said gate dielectric, and applying a second given concentration of carriers of the second conductivity type, which is less than said first given concentration, to the exposed surface of said chip through said third window mask;

diffusing said carriers of said first and second given concentrations of said second conductivity type to their final depths which are less than the final depth of said increased conduction regions of the first conductivity type, with said carriers of said first given concentration forming a body of high concentration and said carriers of said second given concentration forming a low concentration channel region which surrounds said body of high concentration and underlies said gate electrode;

applying a high concentration of carriers of said first conductivity type through said third window mask and diffusing them to form shallow source regions which diffuse laterally to underlie said gate dielectric and bounds the inner edge of said low concentration channel region;

and thereafter forming a source electrode on said source regions and a drain electrode which is electrically connected to said chip.

2. The method of claim 1, in which said carriers of said first type which are applied through said first window mask are diffused to a final depth which is reached by a diffusion of that concentration of carriers at about 1175° C. for about 10 hours.

3. The method of claim 1, which includes the further step of reducing the lifetime of said semiconductor chip.

4. The method of claim 1, wherein said completed chip is thereafter exposed to an electron flux of greater than about 12 megarads.

5. The method of claim 1, wherein said completed chip is thereafter exposed to irradiation to kill lifetime.

6. The method of claim 1, which includes the further step of diffusing heavy metal atoms into said chip to kill lifetime.

7. The method of claim 2, which includes the further step of diffusing heavy metal atoms into said chip to kill lifetime.

8. The method of claim 1 wherein said carriers of said first conductivity type which are applied through said first window mask are implanted at a dose of greater than $3 \times 10^{12}$ atoms per square centimeter.

9. The method of claim 1 wherein said first window mask is formed by forming an oxide layer on said surface of said chip, applying and patterning a photoresist layer, and then etching away portions of said oxide layer.

10. The method of claim 1 wherein said second window mask is formed by forming an oxide layer on said surface of said chip, applying and patterning a photoresist layer, and then etching away portions of said oxide layer.

11. The method of claim 1 wherein said third window mask is formed by forming a further oxide layer atop said conductive gate electrode, applying and patterning a photoresist layer atop said further oxide layer, etching portions of said further oxide layer, removing said photoresist layer and then etching said conductive gate electrode and said gate dielectric.

12. A method of manufacture of a power semiconductor device comprising the steps of:

applying carriers of first conductivity type to the exposed surface of a semiconductor chip which is of the first conductivity type and diffusing said carriers to a first depth into said substrate to form regions of increased conduction;

forming a first window mask and applying a first given concentration of carriers of the second conductivity type to said chip surface through said first window mask;

forming a gate dielectric and a conductive gate electrode over at least portions of the surface of said regions of increased conduction;

forming a second window mask which surrounds and is at least adjacent to the locations of respective ones of said first window mask and bounded by respective areas of said gate dielectric and applying a second given concentration of carriers of the second conductivity type, which is less than said first given concentration, to said exposed chip surface through said second window mask;

diffusing said carriers of said first and second given concentrations of said second conductivity type to their final depths which are less than the final depth of said increased conduction regions of the first conductivity type, with said carriers of said first given concentration forming a body of high concentration and said carriers of said second given concentration forming a low concentration channel region which surrounds said body of high concentration and underlies said gate dielectric;

applying a high concentration of carriers of said first conductivity type through said second window mask and diffusing them to form shallow source regions which diffuse laterally to underlie said gate dielectric and bounds the inner edge of said low concentration channel region; and forming a source electrode on said source regions and a drain electrode which is electrically connected to said chip.

13. The method of claim 12, in which said carriers of said first type which are applied through said first mask window means are diffused to a final depth which is reached by a diffusion of that concentration of carriers at about 1175° C. for about 10 hours.

14. The method of claim 12, which includes the further step of reducing the lifetime of said semiconductor chip.

15. The method of claim 12, wherein said completed chip is thereafter exposed to an electron flux of greater than about 12 megarads.

16. The method of claim 12, wherein said completed chip is thereafter exposed to irradiation to kill lifetime.

17. The method of claim 12, which includes the further step of diffusing heavy metal atoms into said chip to kill lifetime.

18. The method of claim 12 wherein said first window mask is formed by forming an oxide layer on said surface of said chip, applying and patterning a photoresist layer, and then etching away portions of said oxide layer.

19. The method of claim 12 wherein said second window mask is formed by forming a further oxide layer atop said conductive gate electrode, applying and patterning a photoresist layer atop said further oxide layer, etching portions of said further oxide layer, removing said photoresist layer and then etching said conductive gate electrode and said gate dielectric.

* * * * *